United States Patent [19]

Yamamoto et al.

[11] Patent Number: 5,050,037
[45] Date of Patent: Sep. 17, 1991

[54] LIQUID-COOLING MODULE SYSTEM FOR ELECTRONIC CIRCUIT COMPONENTS

[75] Inventors: Haruhiko Yamamoto; Kouji Katsuyama, both of Yokohama; Mitsuhiko Nakata, Kawasaki; Shunichi Kikuchi, Yokohama, all of Japan

[73] Assignee: Fujitsu Limited, Kawasaki, Japan

[21] Appl. No.: 251,978

[22] Filed: Sep. 29, 1988

Related U.S. Application Data

[63] Continuation of Ser. No. 27,074, Mar. 17, 1987, abandoned, which is a continuation of Ser. No. 693,432, Jan. 22, 1985, abandoned.

[30] Foreign Application Priority Data

Jan. 26, 1984 [JP] Japan .................................. 59-13005
Jan. 26, 1984 [JP] Japan .................................. 59-13006
Jan. 26, 1984 [JP] Japan .................................. 59-13007

[51] Int. Cl.⁵ .............................................. H05N 7/20
[52] U.S. Cl. .................................. 361/385; 165/80.4; 357/79; 357/82; 361/386
[58] Field of Search .............. 165/80.4; 174/16.3, 174/15.1; 357/79, 82; 361/383–386, 389

[56] References Cited

U.S. PATENT DOCUMENTS

| 3,389,305 | 6/1968 | Bond ........................... 357/82 |
| 3,649,738 | 3/1972 | Andersson et al. ............ 174/15 R |
| 3,921,201 | 11/1975 | Eisele et al. .................... 357/82 |
| 4,138,692 | 2/1979 | Meeker et al. ................. 357/82 |
| 4,156,458 | 5/1979 | Chu et al. ....................... 165/81 |
| 4,341,432 | 7/1982 | Cutchaw ........................ 339/112 |
| 4,536,824 | 8/1985 | Barrett et al. .................. 361/384 |

FOREIGN PATENT DOCUMENTS

| 1120604 | 9/1982 | Canada . |
| 2345626 | 3/1975 | Fed. Rep. of Germany . |
| 2800080 | 7/1978 | Fed. Rep. of Germany . |

OTHER PUBLICATIONS

A. L. Pascuzzo et al., "Integrated Circuit Module Package Cooling Structure", IBM Technical Disclosure Bulletin, vol. 20, No. 10, 3/78, pp. 3898–3899.

Primary Examiner—Gregory D. Thompson
Attorney, Agent, or Firm—Armstrong, Nikaido, Marmelstein, Kubovcik, & Murray

[57] ABSTRACT

A printed circuit board assembly having a printed circuit board mounted, on both faces, heat generative electronic circuit components, such as integrated circuit chips, and a pair of liquid-cooling modules arranged on both sides of the printed circuit board. Each of the liquid-cooling modules is provided with a liquid cooling plate having liquid coolant supply heads and a plurality of resilient heat transfer units held by the liquid-cooling plate and arranged in compressive contact with the electronic circuit components on both faces of the printed circuit board.

24 Claims, 9 Drawing Sheets

LIQUID-COOLING MODULE SYSTEM FOR ELECTRONIC CIRCUIT COMPONENTS

This application is a continuation of application Ser. No. 27,074 filed Mar. 17, 1987, now abandoned, which is a continuation of Ser. No. 693,432 filed on Jan. 22, 1985, now abandoned.

BACKGROUND OF THE INVENTION

1. Field of the Invention

The present invention relates to a liquid-cooling system for electronic circuit components, such as semiconductor chips or integrated circuit chips (IC), mounted on a printed circuit board. More particularly, the present invention relates to a printed circuit board assembly including a printed circuit board having electronic circuit components mounted on both front and back faces and cooled by liquid-cooling modules arranged on both sides of the printed circuit board.

2. Description of the Related Art

A typical liquid-cooling plate assembly used for cooling circuit components mounted on a printed circuit board or boards, is disclosed in U.S. Pat. No. 4,155,402. In this liquid-cooling plate assembly, a liquid-cooled, cold plate with a compliant mat interface made of a heat conductive, electrically insulating compliant structure is arranged in compressive contact with diverse circuit components on a printed circuit board so that intimate contact can be achieved with the circuit components, in spite of differences in the relative heights and shapes of the circuit components. The conventional liquid-cooling plate assembly, however, is intended to be fastened to the printed circuit board in such a manner that only the circuit components mounted on one face of the board are cooled when the liquid cooled, cold plate is brought into compressive contact with the components via the compliant mat interface. That is, the printed circuit board is subjected to a one-way pressure acting on one face of the board, and as a result, it is difficult to avoid sagging or deflection in the printed circuit. board. Consequently, the circuit components on the printed circuit board must suffer from mechanical stress. Further, since the larger the size of the printed circuit board, the larger the amount of sag in the printed circuit board, it is not always possible to ensure that all of the circuit components on the face of the board are uniformly cooled. Moreover, in the conventional liquid-cooling plate assembly, the cold plate is cooled by liquid coolant flowing through channels formed in the cold plate, and a rather thick layer of solid plate remains between the liquid coolant flowing through the channels and the face of the liquid-cooling plate assembly in contact with the circuit components.

SUMMARY OF THE INVENTION

An object of the present invention is to provide a printed circuit board assembly with liquid-cooling modules arranged in such a manner that sagging or deflection of a printed circuit board is prevented and mechanical stress on the electronic circuit components mounted on the printed circuit board is eliminated.

Another object of the present invention is to provide a printed circuit board assembly with liquid-cooling modules in which a sufficient amount of liquid coolant is brought about each of the heat transfer plates of the assembly in contact with each of the electronic circuit components, mounted on both faces of a printed circuit board, in such a manner that the heat removal efficiency of each heat transfer plate of the assembly is enhanced.

A further object of the present invention is to provide a liquid-cooling module capable of uniformly cooling all electronic circuit components mounted in a high density on a printed circuit board.

In accordance with the present invention, there is provided a printed circuit board assembly which comprises a printed circuit board having first and second faces for mounting thereon at least one electronic circuit component, respectively, and a pair of first and second liquid-cooling modules arranged on both sides of the printed circuit board for removing heat generated by the electronic circuit components mounted on the respective first and second faces of the printed circuit board. Each of the first and second liquid-cooling modules comprises a cooling plate arranged in such a manner that it is spaced apart from the associated first or second face of the printed circuit board and having therein passage means for flowing a liquid coolant under pressure, and resilient heat transfer means intervened between the cooling plate and the associated first or second face of the printed circuit board in substantial alignment with the electronic circuit component, the resilient heat transfer means having, at one end thereof, a heat transfer plate cooled by the liquid coolant fed from the cooling plate, and arranged in compression contact with the electronic circuit component.

DESCRIPTION OF THE PREFERRED EMBODIMENTS

Figure 1:
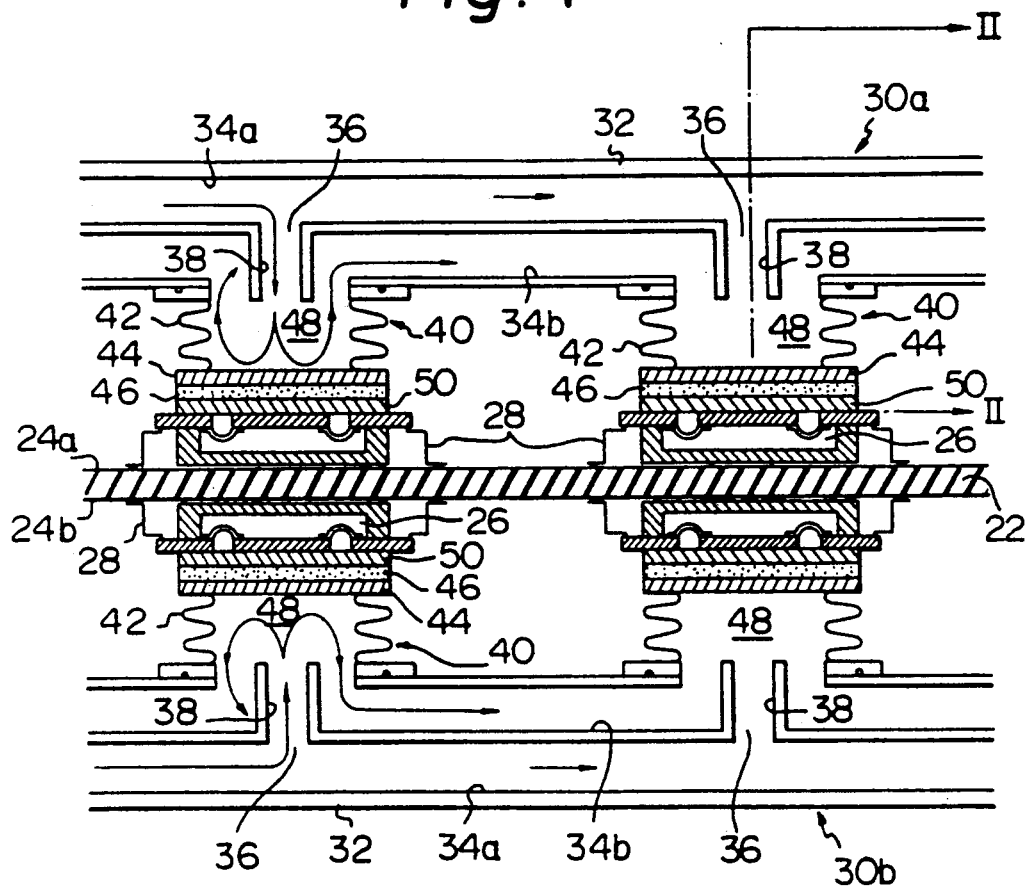
FIG. 1 is a vertical cross-sectional view of a part of a printed circuit board assembly, according to one embodiment of the present invention.

Referring to FIG. 1, a printed circuit board assembly includes a printed circuit board 22 having a first face 24a and second face 24b on which electronic circuit components 26, such as semiconductor chips are mounted. The semiconductor chips may be either bare chips or packaged chips. The electronic circuit components 26 are electrically connected to the conductors of the first and second faces 24a and 24b by means of leads 28.

The printed circuit board assembly also includes a first liquid-cooling module 30a arranged on the side of the first face 24a, and a second liquid-cooling module 30b arranged on the side of the second face 24b of the printed circuit board 22. The first and second liquid-cooling modules 30a and 30b are of the same construction, having a liquid-cooling plate 32 arranged in such a manner that it is spaced apart from the printed circuit board 22, and resilient heat transfer units 40, each of which is arranged in alignment with each associated electronic circuit component 26. The liquid-cooling plate 32 has a passage 34a for an incoming liquid coolant under pressure, and a passage 34b for liquid coolant discharge. The liquid-coolant plate 32 also has liquid coolant supply heads 36 for supplying the incoming liquid coolant to the associated resilient heat transfer units 40, respectively. Each liquid coolant supply head 36 has a nozzle 38 for supplying the liquid coolant from the passage 34a into each associated resilient heat transfer unit 40. The supplied liquid coolant returns to the passage 34b after passing through the nozzle 38, as best shown by arrows in FIG. 2. Each resilient heat transfer unit 40 has a hollow resilient member 42 constructed as a bellows, one end of which is fixed to the cooling plate 32 at a position surrounding the opening of the associated liquid coolant supply head 36, and sealed by a suitable sealing member. The other end of the hollow resilient member 42 is tightly closed by a heat transfer plate 44 to which a compliant heat transfer member 46, preferably formed as a sheet member, is fixed. Thus, within the hollow resilient member 42, there is provided a liquid coolant receiving chamber 48 intercommunicating with the liquid coolant supply head 36. Each compliant heat transfer member 46 is placed in intimate contact with a heat transfer plate 50 fixed to the face of the electronic circuit component 26 when the first and second liquid-cooling modules 30a and 30b are brought into compressive contact with the printed circuit board 22 having the electronic circuit components 26 mounted on both first and second faces 24a and 24b. As a result, the first and second liquid-cooling modules 30a and 30b remove the heat generated from the electronic circuit components 26 on the first and second faces 24a and 24b of the printed circuit board 22, since the heat generated is transferred through the heat transfer plates 50 and the compliant heat transfer members 46 to the heat transfer plates 44 cooled by the liquid coolant, which is supplied from the liquid coolant supply heads 36 and impinges upon the heat transfer plates.

The hollow resilient member 42 of the respective resilient heat transfer units 40 may be either a metallic bellows made by a conventional forming, welding, and electrodepositing methods, or non-metallic bellows made of, e.g., tetrafluoroethylene, providing that they have an appropriate resiliency sufficient to ensure a stable contact between the heat transfer plates 44 and 50 via the heat transfer member 46 while absorbing any slight differences in the heights of the electronic circuit components 26. Alternatively, the hollow resilient member 42 may be constructed of a conventional diaphragm element having the same appropriate resiliency.

The heat transfer plates 44 of the respective resilient heat transfer units 40 are preferably made of highly heat conductive material, such as copper and copper alloy. On the other hand, the heat transfer plates 50 must also be made of a heat conductive or dissipating material having a coefficient of thermal expansion approximately the same as or near to that of the electronic circuit components 26. For example, if the electronic circuit components 26 are integrated circuit chips containing silicon wafer semiconductor devices or gallium arsenic wafer semiconductor devices, the heat transfer plates 50 should be made of molybdenum or a composite of molybdenum and copper.

The compliant heat transfer members 46 must be electrically insulative, heat conductive, and have a good compliancy, and may be constructed of a binder, such as silicone rubber, and metal oxide filler such as alumina and berylia.

The liquid coolant may be water, fluorocarbon, or liquid metal, and is preferably supplied from the respective nozzles 38 of the liquid coolant supply heads 36 at a velocity ranging from 0.5 through 3 meters per second. Further, assuming that the inner diameter of each nozzle 38 is "D", the distance from the opening end of each nozzle 38 to the surface of each associated heat transfer plate 44 is selected as from 2D through 4D, and the diameter of each heat transfer plate 44 is selected as from 4D through 8D, to ensure that an appropriate cooling effect is applied to the respective electronic components. The impinging jet heat transfer coefficient is preferably 10,000 through 30,000 $KCal/cm^2 \cdot h \cdot °C$.

Figure 2:
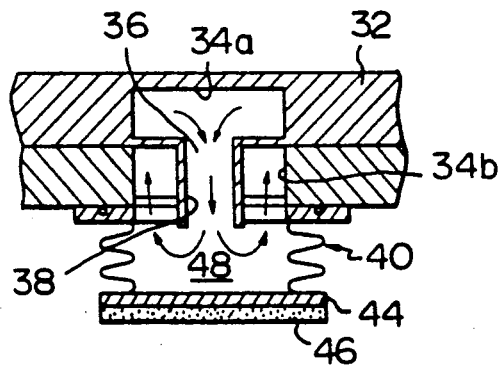
FIG. 2 is a partial, cross-sectional view taken along the line II—II of FIG. 1.
Figure 3:
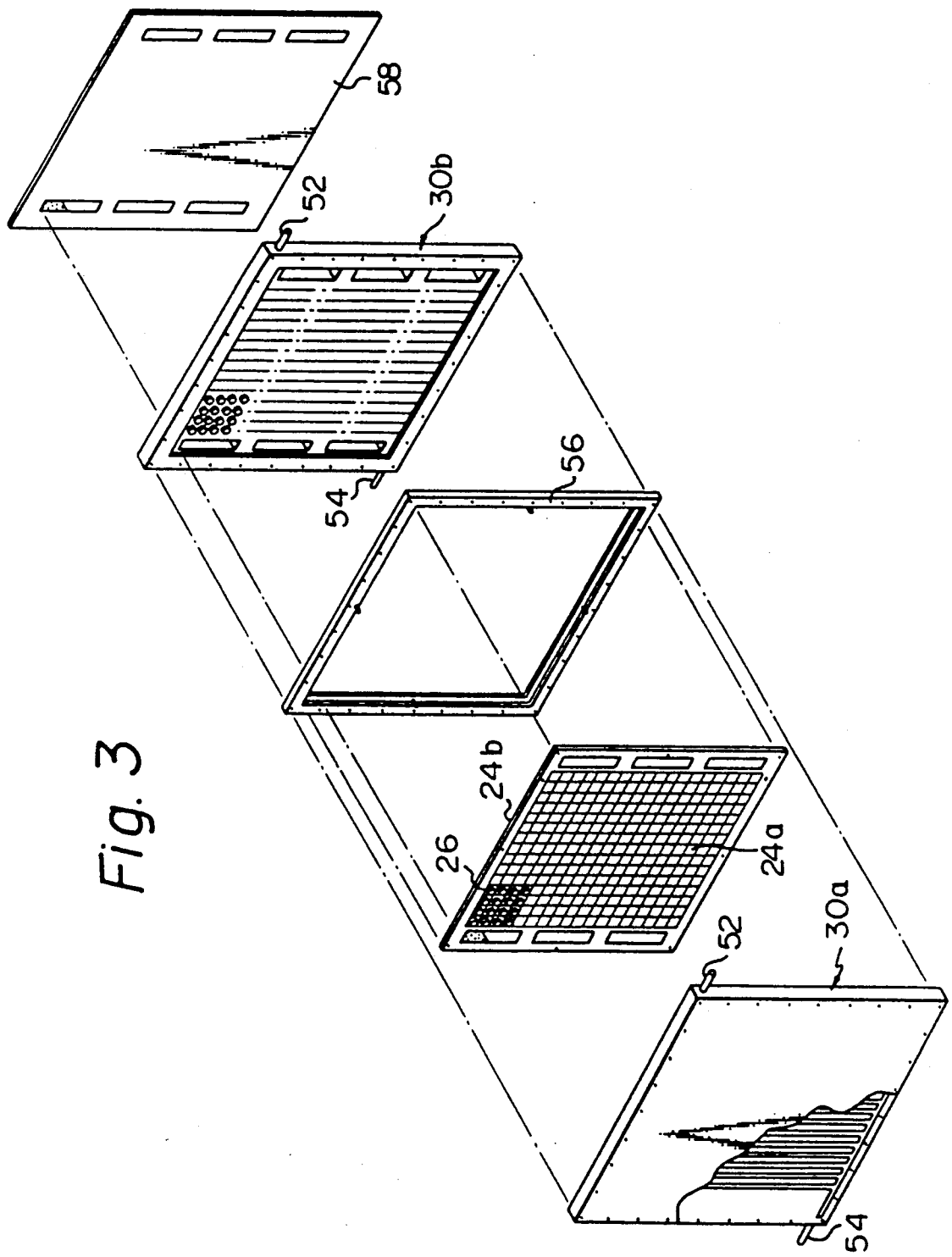
FIG. 3 is an exploded perspective view of the embodiment as shown in FIG. 1.

FIG. 3 is an exploded view of the printed circuit board assembly 20 shown in FIGS. 1 and 2. The printed circuit board assembly 20 is supported by a support frame 56 and a back-up plate 58, as required. That is, the printed circuit board 22 having a plurality of electronic circuit components 26 on both sides 24a and 24b is fitted in the support frame 56 and is subsequently sandwiched by the first and second liquid-cooling modules 30a and 30b. The back-up plate 58 is then applied to the outside of one of the modules, for example, module 30b. Finally, the printed circuit board 22, the first and second liquid-cooling modules 30a and 30b, the support frame 56, and the back-up plate 58 are all fastened tightly together by screws. In FIG. 3, reference numerals 52 and 54 designate a liquid inlet pipe connectable to a liquid coolant supply source, such as a hydraulic pump, through appropriate piping, and a liquid coolant outlet pipe connectable to a heat exchange unit, such as a radiator, respectively.

It should be understood that, according to the above-mentioned arrangement of the printed circuit board assembly 20, since contact compression acts on both sides of the printed circuit board 22, heat generative electronic circuit components 26 mounted in high density on both faces of the printed circuit board can be effectively cooled by the pair of first and second liquid-cooling modules 30a, 30b without the occurrence of unfavorable sagging or deflection in the printed circuit board caused by mechanical stress. Thus, since the electronic circuit components 26 are not subjected to any appreciable mechanical stress, it is ensured that the electrical connection between the electronic circuit components and the printed circuit board is maintained in a stable condition. The provision of the compliant heat transfer member 46 between the heat transfer plates 44 and 50 is effective for absorbing surface unevenness of both plates 44 and 50.

Figure 4:
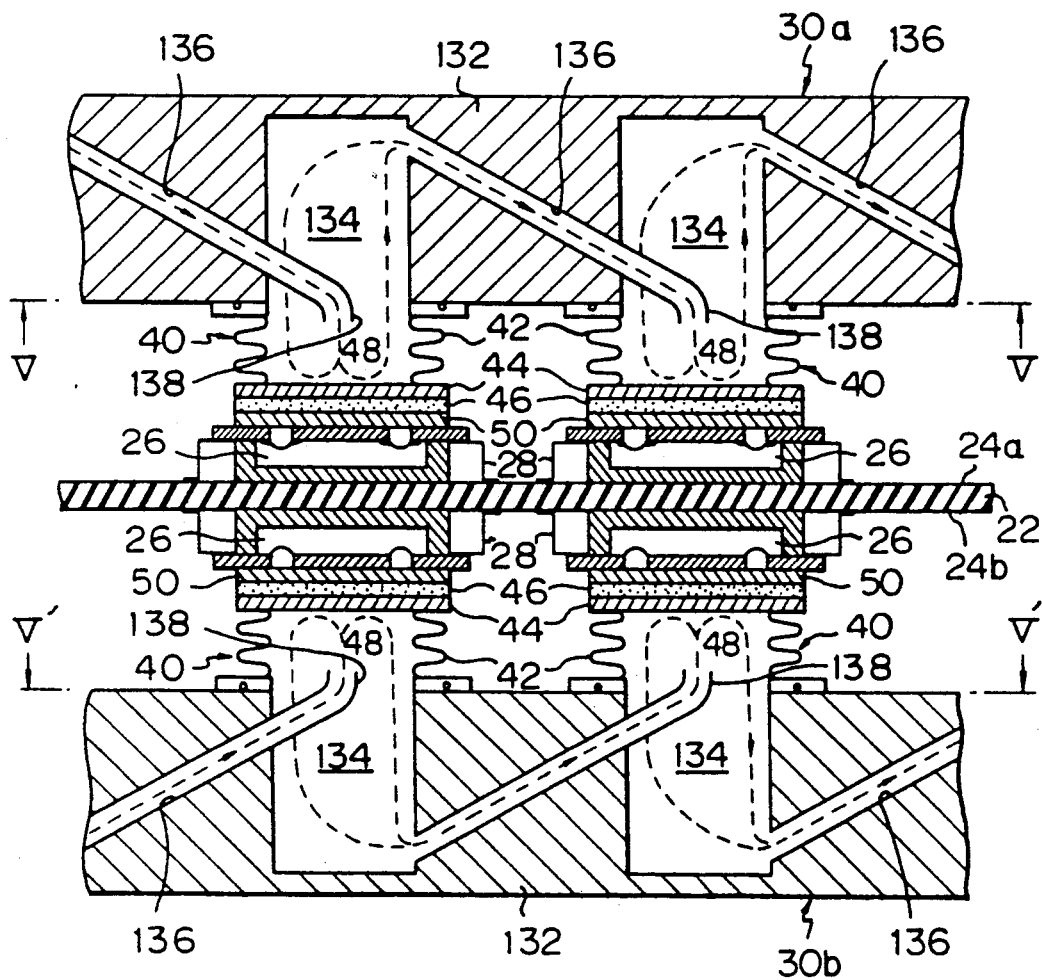
FIG. 4 is a vertical cross-sectional view of a part of a printed circuit board assembly according to another embodiment of the present invention.
Figure 5:
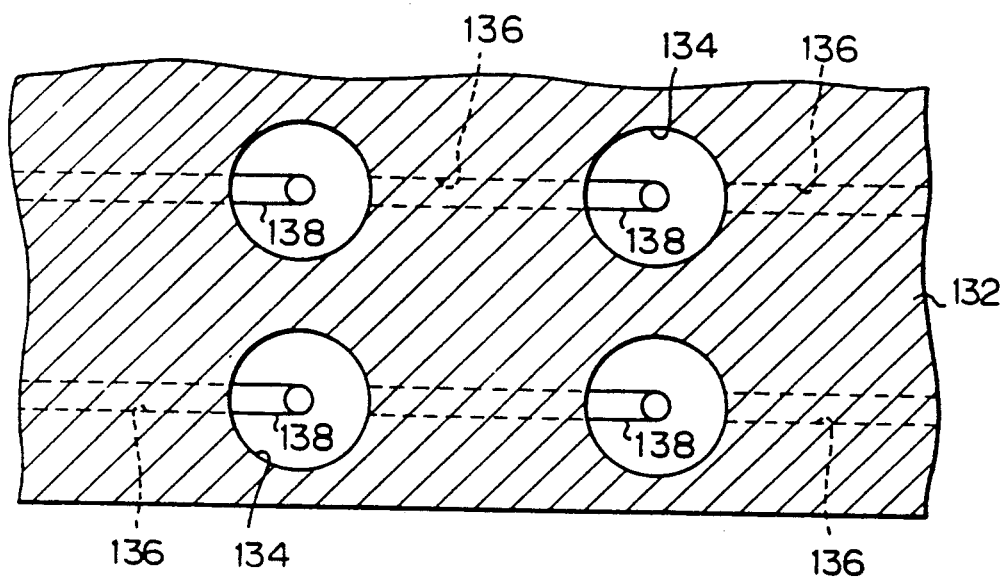
FIG. 5 is a partial, cross-sectional view of a liquid-cooling plate, taken along the line V—V or V'—V' of FIG. 4.

FIGS. 4 and 5 illustrate another embodiment of the printed circuit board assembly 20 of the present invention. In FIGS. 4 and 5, the same reference numerals as those in FIGS. 1 through 3 designate the same or like elements or portions.

The major difference between the present embodiment of FIGS. 4 and 5 and that shown in FIGS. 1 through 3 resides in the construction of the liquid coolant flowing system provided for each liquid-cooling plate 132 of the present embodiment.

In FIGS. 4 and 5, the liquid-cooling plate 132 of each of the first and second liquid-cooling modules 30a and 30b is formed with a plurality of liquid coolant chambers 134 arranged in alignment to and intercommunicating with the respective liquid coolant receiving chambers 48 of the associated resilient heat transfer units 40. Each liquid coolant chamber 134 is formed as a cylindrical recess arranged vertical to the flat face of each liquid-cooling plate 132, as shown in FIGS. 4 and 5. The two adjacent liquid coolant chambers 134 are interconnected by a liquid coolant passage 136 which lies in a plane containing the respective central axes of the two adjacent liquid coolant chambers 134. The liquid coolant passage 136 is inclined with respect to the central axis of each liquid coolant chamber 134. That is, one end of the passage 136 opens at a position adjacent to the closed end of one of the two adjacent liquid coolant chambers 134, and the other end of the liquid coolant passage 136 opens in proximity to the open end of the other liquid coolant chamber 134. This inclined arrangement of the liquid coolant passages 136 simplifies the making of these passages 136, as described later. A nozzle 138 is attached to the end of each liquid coolant passage 136 so as to supply the liquid coolant from the passage 136 into the liquid coolant receiving chamber 48 of the hollow resilient member 42. The supplied liquid coolant then impinges upon and cools the heat transfer plate 44. The liquid coolant is subsequently reflected back from the heat transfer plate 44 into the liquid coolant chamber 134 and flows into the succeeding liquid coolant passage 136. Thereafter, the liquid coolant is again supplied by the succeeding nozzle 138. Dotted lines with arrows shown in FIG. 4, indicate the flow of the liquid coolant in the first and second liquid-cooling modules 30a and 30b. That is, since the liquid coolant chambers 134 and the liquid coolant passages 136 are arranged alternately and in series in a linear direction, an equal amount of liquid coolant flow passes through the liquid coolant chambers 134 and the liquid coolant passages 136 under a predetermined pressure. Accordingly, it is ensured that each of the nozzles 138 of the serially arranged liquid coolant supply heads supply an equal amount of the liquid coolant to each of the heat transfer plates 44 of the respective resilient heat transfer units 40. As a result, the cooling effect applied by the supplied liquid coolant to each of the heat transfer plates 44 can be made equal. This means that if the predetermined pressure under which the liquid coolant is supplied from a liquid coolant supply source (not illustrated in FIGS. 4 and 5) is appropriately changed, it is possible to set the flow velocity of the liquid coolant and the Reynolds number of the flow at desired values, respectively.

Figure 6A:
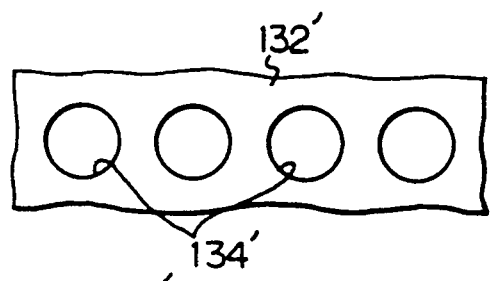
FIGS. 6A through 6F are partial plan and cross-sectional views illustrating the manufacturing process of the liquid-cooling plate, as shown in FIGS. 4 and 5.
Figure 6B:
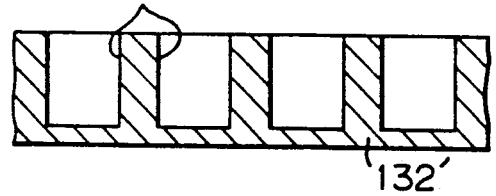
Figure 6C:
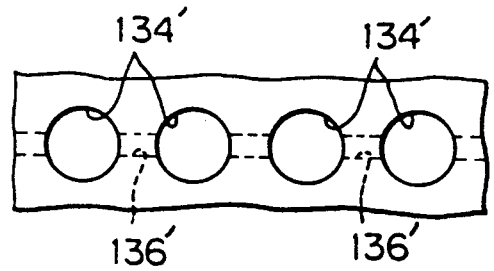
Figure 6D:
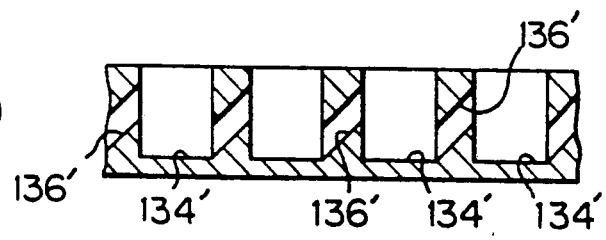
Figure 6E:
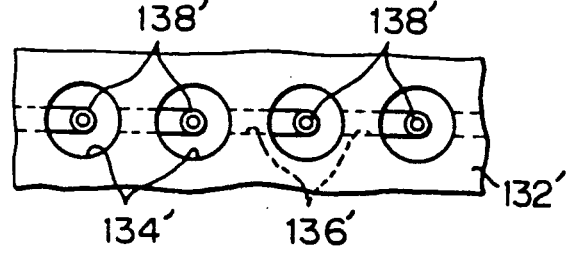
Figure 6F:
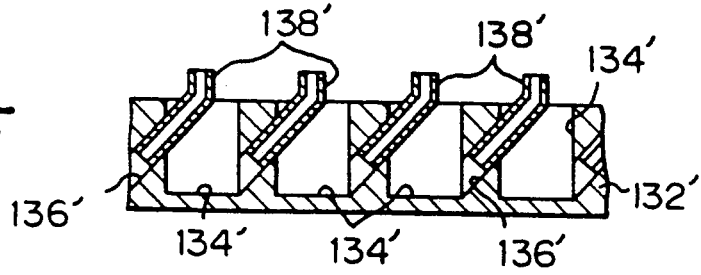

FIGS. 6A through 6F illustrate the manufacturing process of the liquid-cooling plate 132 employed in the embodiment shown in FIGS. 4 and 5. FIGS. 6A, 6C, and 6E are plan views of the liquid-cooling plate at respective stages of the manufacturing process, while FIGS. 6B, 6D, and 6F are corresponding cross-sectional views, respectively.

At the first stage of the manufacturing process, a blank 132' of the liquid-cooling plate 132 is formed with a plurality of bores 134' arranged at a predetermined spacing by means of, for example, a conventional boring machine, as shown in FIGS. 6A and 6B. The bores 134' are intended to be used as the liquid coolant chambers 134. The arrangement of the bores 134' may, of course, be changed in accordance with the arrangement of the electronic circuit elements 26 (FIG. 4) on the printed circuit board 22 (FIG. 4).

At the second stage of the manufacturing process, as shown in FIGS. 6C and 6D, inclined bores 136' intended for use as the liquid coolant passages 136 are drilled or bored by a conventional drilling machine or boring machine. The inclination of the respective bores 136' is chosen so that a drilling cutter or boring cutter smoothly progresses from above each of respective bores 134' toward the bottom of the neighbouring bore 134'. It should be noted that the same angle of inclination is used for all bores 136'.

At the third stage of the manufacturing process, as shown in FIGS. 6E and 6F, curved tubes 138' intended for use as nozzles 138 are inserted into and tightly fixed in the inclined bores 136'. Thus the manufacturing of the liquid-cooling plate 132 is completed. The curved tubes 138' are provided by a separate manufacturing process.

From the foregoing, it will be understood that the manufacturing of the liquid-cooling plate 132 can be easily achieved by employing a conventional boring machine and a drilling machine. If highly automated machine tools, such as machining centers are employed, mass production of numbers of liquid cooling plates 132 can be achieved simply and at a low cost.

The completed liquid cooling plate 132 is assembled with the resilient heat transfer units 40 (FIG. 4), so that one set of liquid cooling modules 30a or 30b is complete.

Figure 7:
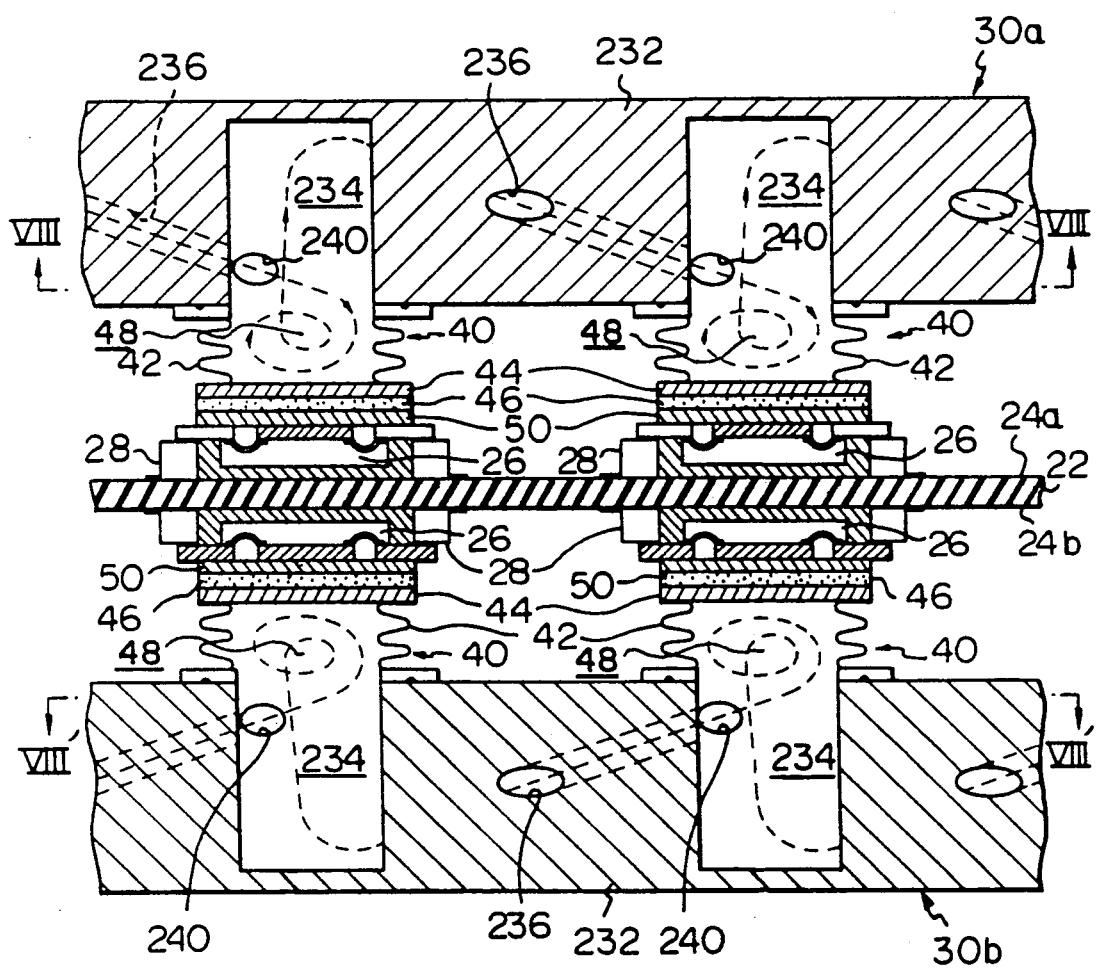
FIG. 7 is a vertical cross-sectional view of a part of a printed circuit board assembly according to a further embodiment of the present invention.
Figure 8:
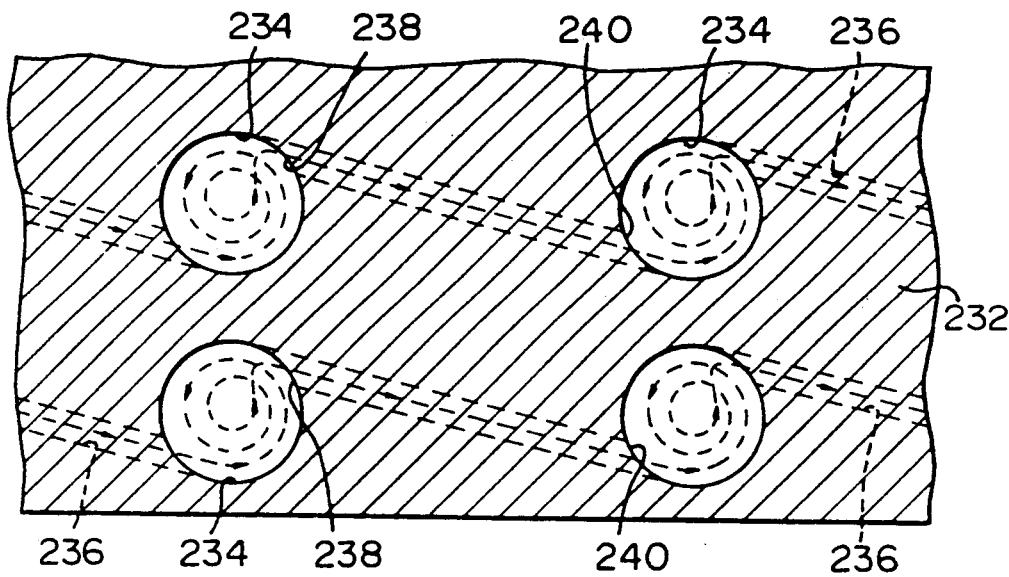
FIG. 8 is a partial, cross-sectional view of a liquid-cooling plate, taken along the line VIII—VIII or VIII'—VIII' of FIG. 7.

FIGS. 7 and 8 illustrate a further embodiment of the printed circuit board assembly 20 of the present invention. In FIGS. 7 and 8, the same reference numerals as those in FIGS. 4 and 5 designate the same or like elements or portions. Therefore, the description will be provided hereinbelow only with respect to the difference between the present embodiment shown in FIGS. 7 and 8 and that shown in FIGS. 4 and 5.

In the present embodiment, the liquid coolant system provided for liquid-cooling plates 232 of the first and second liquid-cooling modules 30a and 30b is constructed in such a manner that a spiral flow of the liquid coolant is supplied from the respective liquid coolant supply heads toward the respective associated resilient heat transfer units 40. In each liquid-cooling plate 232, a liquid coolant passage 236 fluidly intercommunicating two adjacent cylindrical-recess-type liquid coolant chambers 234 is formed in such a manner that the axis of the liquid coolant passage 236 intersects neither one of the axes of the two adjacent liquid coolant chambers 234. That is, on the other hand, a vertical plane containing therein the axes of the two adjacent liquid coolant chambers 234 intersects the axis of the liquid coolant passage 236 extending between the two adjacent liquid coolant chambers 234. Further, the liquid coolant passage 236 is inclined inwardly with respect to the flow direction of the liquid coolant shown by dotted lines with arrows. As a result, one end 238 of the liquid coolant passage 236 opens at a position adjacent to the closed end of one of the two adjacent liquid coolant chambers 234, i.e., the chamber 234 on the upstream side, and the other end 240 of the liquid coolant passage 236 opens in proximity to the opening of the other liquid coolant chamber 234, i.e., the chamber 234 on the downstream side.

The above-described arrangement of the liquid coolant passages 236 formed in the liquid cooling plate 232 enables the liquid coolant to be supplied from respective ends 240 in the form of a high speed spiral flow within each of the liquid coolant receiving chambers 48 of the respective resilient heat transfer units 40. As a result, the spiral flow of the liquid coolant comes into contact with a large part of the surface of each heat transfer plate 44, and thereby applies a sufficient cooling effect to the heat transfer plate 44. Thus, the cooling performance of each of the first and second liquid cooling modules 30a and 30b is enhanced.

It should here be noted that, in the embodiment of FIGS. 7 and 8, it is not necessary to provide a nozzle element for each liquid coolant supply head.

It should also be noted that since the entire spiral flow of the liquid coolant from each of the liquid coolant supply heads subsequently flows into the adjacent liquid coolant head on the downstream side, the flow system of the liquid coolant of the present embodiment can be basically considered a serial flow system similar to the flow system of the previous embodiment of FIGS. 4 and 5.

At this stage, it should be understood that the liquid cooling module 30a or 30b having the serial flow system of the liquid coolant as illustrated in FIGS. 4 and 5 or FIGS. 6 and 7 can be employed for cooling the electronic circuit components, such as integrated circuit chips, mounted on only one face of a printed circuit board.

Figure 9:
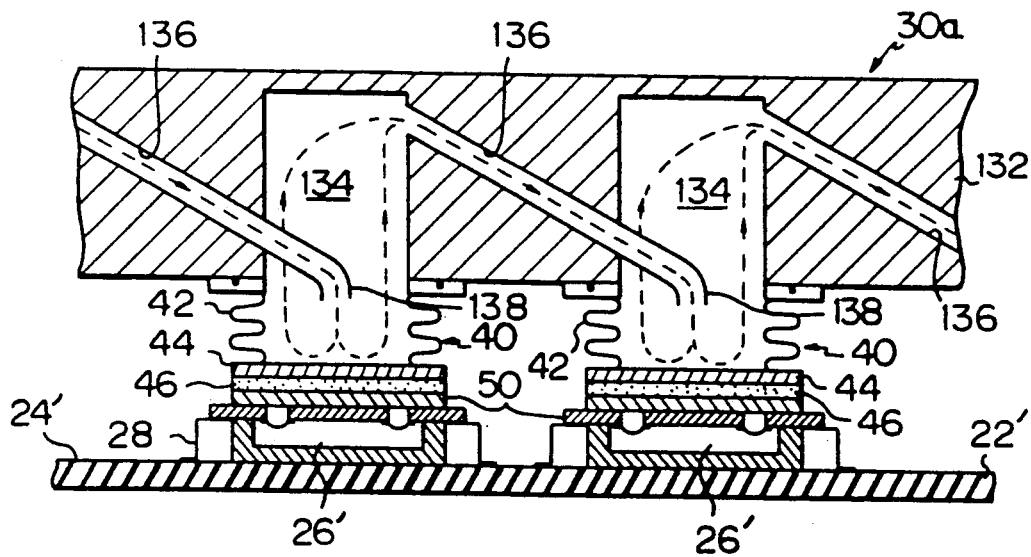
FIG. 9 is a vertical cross-sectional view of a printed circuit board assembly which includes a printed circuit board having integrated circuit chips mounted on a single face of the board, according to the present invention.

FIG. 9 illustrates a typical case wherein the liquid cooling module 30a of the embodiment of FIGS. 4 and 5 is employed for cooling integrated circuit chips 26' mounted on one face 24' of a printed circuit board 22'. Alternatively, the liquid cooling modules 30a or 30b of the embodiment of FIGS. 7 and 8 may be employed for cooling the integrated circuit chips 26' mounted on the face 24' of the printed circuit board 22'.

Figure 10:
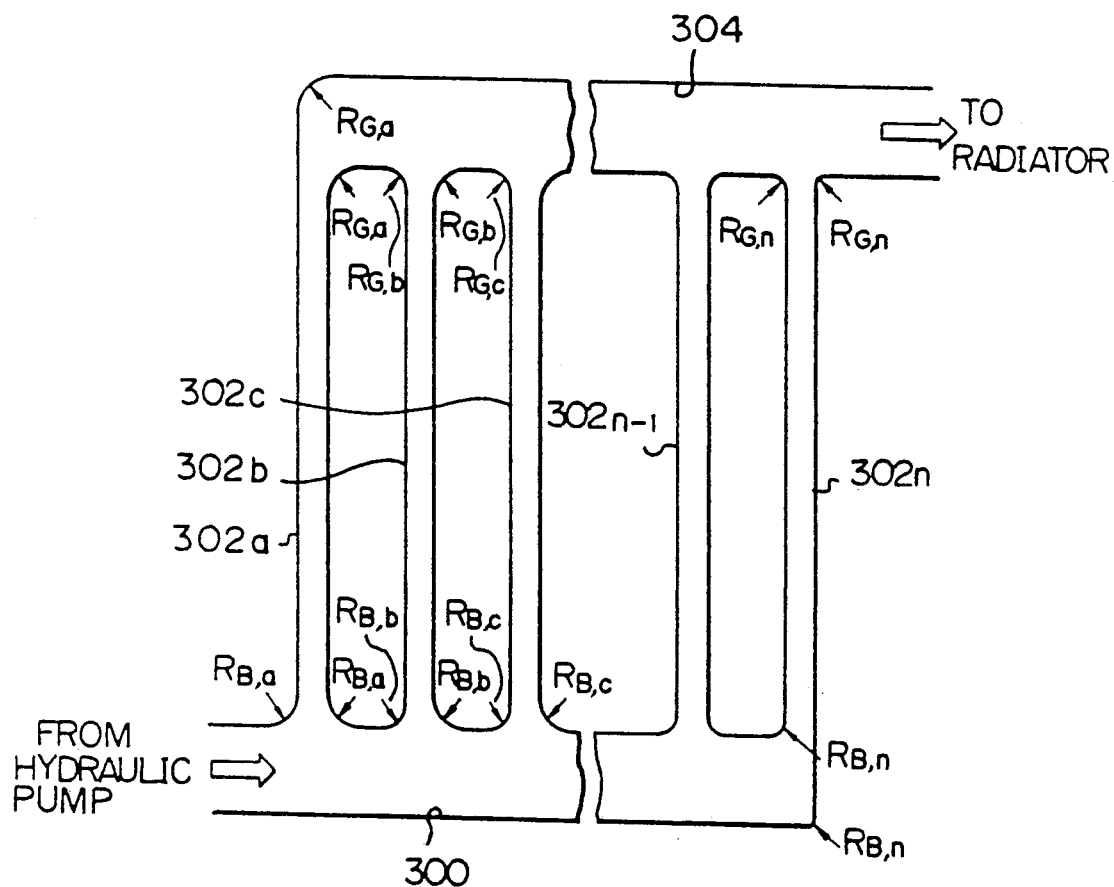
FIGS. 10 and 11 are schematic views of the twin liquid coolant flow system employed by the printed circuit board assembly of the present invention.

FIG. 10 schematically illustrates a liquid coolant flow system embodying the supply of cold liquid coolant from a supply source to each liquid-cooling plate of the liquid cooling module 30a or 30b according to one of the three embodiments of FIGS. 4 and 5, FIGS. 7 and 8, and FIG. 9, and the collection of the liquid coolant discharged from the liquid-cooling plate toward a liquid coolant heat exchange unit such as a radiator.

The liquid coolant flow system includes a liquid inlet main passage 300, a liquid outlet main passage 304, and a plurality of liquid branch passages 302a through 302n. The liquid inlet main passage 300 is connected to a liquid coolant supply source, such as a hydraulic pump, for introducing cold liquid coolant therein under a predetermined pressure, while the liquid outlet main passage 304 is connected to a liquid coolant heat exchange unit such as a radiator. The liquid branch passages 302a through 302n are all connected between the liquid inlet main passage 300 and the liquid outlet main passage 304, and arranged in parallel with one another. Therefore, the cold liquid coolant is fed from the main inlet passage 300 to each of the branch passages 302a through 302n, and the discharged liquid coolant from each of the branch passages 302a through 302n is collected and discharged by the main outlet passage 304. At this stage, it is to be understood that along each of the branch passages 302a through 302n, there is arranged a plurality of liquid coolant supply heads 36 disclosed in the foregoing description of the three embodiments of FIGS. 4 through 9.

The liquid branch passages 302a through 302n are respectively connected to the liquid main inlet passage 300 by way of respective rounded branching corners having different curvatures. The liquid branch passages 302a through 302n are also connected to the liquid main outlet passage 304 by way of respective rounded collecting corners. The respective curvatures of the corners of the liquid branch passages 302a through 302n are designed as "Ra" through "Rn" (illustrated as $R_{B,a}$ through $R_{B,n}$ and $R_{G,a}$ through $R_{G,n}$), respectively, in FIG. 10. Further, all liquid branch passages 302a through 302n have an equal cross-sectional area, and preferably, a circular cross section with a diameter "d".

In the present invention, the design of the liquid flow system is made so that the following formulae are established.

$$R_a > R_b > \ldots > R_n \text{ (the branching side)} \tag{1}$$

$$(R_a - R_n)/d \approx 0.1 \text{ through } 0.2 \tag{2}$$

where n is the number of liquid branch passages.

In the liquid flowing system of FIG. 10, the losses $h_B$, $h_G$ of head occurring at respective branching corners from the liquid main inlet passage 300 to respective liquid branch passages 302a through 302n and respective collecting corners from respective liquid branch passages 302a through 302n to the liquid main outlet passage 304 are defined by the following formulae (3) and (4).

$$h_{B,S} = (\zeta_{B,S}) \cdot (V_{B,S})^2 / 2g = (K_{B,S}) \cdot (Q_{m,B,S})^2 \tag{3}$$

$$(S = a, b, \ldots, n)$$

$$h_{G,S} = (\zeta_{G,S}) \cdot (V_{G,S})^2 / 2g = (K_{G,S}) \cdot (Q_{m,G,S})^2 \tag{4}$$

where $\zeta_{B,S}$ is a coefficient of the branching loss of head, $\zeta_{G,S2}$ is a coefficient of the collecting loss of head, $Q_{m,B,S}$ is a flow amount in the liquid main inlet passage 300, $V_{B,S}$ is a flow velocity in the liquid main inlet passage 300, $Q_{m,G,S}$ is a flow amount in the liquid main outlet passage 304, $V_{G,S}$ is a flow velocity in the liquid main outlet passage 304, and g is the acceleration of gravity.

At this stage, the coefficients of the branching loss of head and of the collecting loss of head are affected by the mutual interference of the branching flows of the liquid coolant, if the spacing between the adjacent two liquid branch passage is small. However, the two coefficients generally vary depending on the ratio of the flow amounts in the main and branch passages at respective branching and collecting corners, and on the ratio of the cross sectional areas of the main and branch passages, and the curvatures of respective corners with respect to the diameters of respective branch passages.

By changing the above-mentioned parameters, experiments were conducted to obtain basic data for defining a coefficient of loss of head at the branching corner or junction corner. As a result, the following approximate formula (5) was established.

$$\zeta_S = (\zeta_0 + \alpha e^{-\beta \cdot R_S/d})(Q_S/Q_{m,S})^\gamma (A_S/A_m)^\delta \tag{5}$$

($\zeta_0$, $\alpha$, $\beta$, $\gamma$, and $\delta$ are constants, respectively.). In the formula (5), $Q_S$ is the amount of flow in a branch passage, $A_S$ is the cross-sectional area of the branch passage, $A_m$ is the cross-sectional area of a main passage, d is the diameter of the branch passage corresponding to the cross sectional area $A_S$ of the branch passage, and $R_S$ is the curvature of a corner at the connection between the main and branch passages. $A_S$, $A_m$, and d can be regarded as being constant by considering the solid construction of the flow system of FIG. 10 and the condition wherein the flow of liquid coolant in the flow system is continuous, then if it is assumed that the liquid coolant is equally distributed to every branch passage 302a, 302b, . . . or 302n, the following formulae (6) and (7) can be established.

$$\zeta_{B,S} = K_B(\zeta_{B,0} + \alpha_B e^{-\beta_B \cdot R_{B,S}/d})\{1/(n-S+1)\}^{\gamma_B} \quad (6)$$

$$\zeta_{G,S} = K_G(\zeta_{G,0} + \alpha_G e^{-\beta_G \cdot R_{G,S}/d})(1/S)^{\gamma_G} \quad (7)$$

Thus, $$h_{B,S} = K'_B(\zeta_{B,0} + \alpha_B e^{-\beta_B \cdot R_{B,S}/d})(n-S+1)^{2-\gamma_B}/n^2 \quad (8)$$

and, $$h_{G,S} = K'_G(\zeta_{G,0} + \alpha_G e^{-\beta_G \cdot R_{G,S}/d})(S)^{2-\gamma_G}/n^2 \quad (9)$$

Further, assuming that the tube friction loss in the liquid inlet or outlet main passage is sufficiently small compared with that in the branch passages and the branching and junction losses, it is considered that $\zeta_{B,S} \approx 0$, and $\zeta_{G,0} \approx 0$. If an equal distribution of the liquid coolant to every branch passage is carried out, $h_{B,a} \approx h_{B,b} \approx \ldots \approx h_{B,n}$, and $h_{G,a} \approx h_{G,b} \approx \ldots \approx h_{G,n}$. Thus, $$e^{\beta_B \cdot (R_{B,s} - R_{B,s+1})/d} \approx \{(n-S+1)/(n-S)\}^{2-\gamma_B} \quad (10)$$

and, $$e^{\beta_G \cdot (R_{G,s} - R_{G,s+1})/d} \approx \{S/(S+1)\}^{2-\gamma_G} \quad (11)$$

Accordingly, $$(R_{B,a} - R_{B,n})/d \approx (2-\gamma_B)/\beta_B \cdot \log_e n \text{ (the branching side)} \quad (12)$$

and, $$(R_{G,a} - R_{G,n})/d \approx (\gamma_G - 2)/\beta_G \cdot \log_e n \text{ (the junction side)} \quad (13)$$

It is understood that the formulae (12) and (13) are of the same style as the formula (2).

Consequently, it is understood that by changing the curvatures $R_a$ through $R_n$ of respective corners, it is possible to eliminate 20% of the inequality in the flow amount of the respective liquid branch passages 302a and 302n. Accordingly, the cooling effect of the liquid coolant flowing in all liquid branch passages can be both equal and stable.

Figure 11:
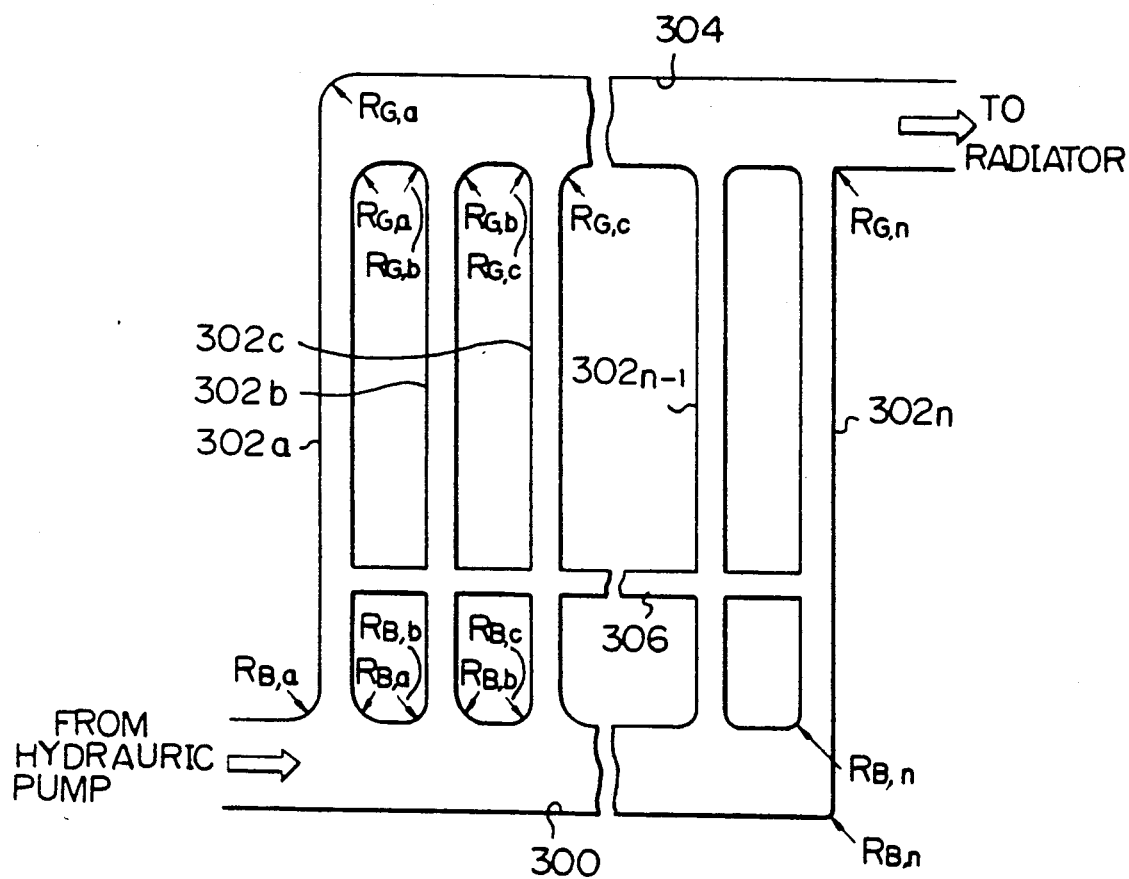

FIG. 11 schematically illustrates another improved liquid coolant flow system embodying the supply and collection of the liquid coolant of a liquid cooling plate.

The liquid coolant system of FIG. 11 is improved over the system of FIG. 10 in that a liquid subsidiary passage 306 is additionally provided for interconnecting all of the liquid branch passages 302a through 302n−1 and 302n. It should be noted that the liquid subsidiary passage 306 is arranged so as to perpendicularly intersect each of the liquid branch passages 302a through 302n at an intermediate point of each passage. It will be understood that provision of the liquid subsidiary passage 306 contributes to equalizing the presure of the liquid coolant in respective liquid branch passages 302a through 302n, resulting in equalizing the cooling effect of the liquid coolant flowing in all liquid branch passages 302a through 302n.

Alternatively, more than one liquid subsidiary passage 306 may be provided. Further, if preferable, the liquid subsidiary passage or passages 306 may be arranged so as to interconnect only some of the liquid branch passages 302a through 302n.

From the foregoing description of preferred embodiments of the present invention it will be understood that, according to the present invention, the printed circuit board assembly provided with the liquid-cooling modules described herein has an excellent cooling performance and can be readily made at a low manufacturing cost.

We claim:

1. A liquid-cooling module for cooling integrated circuit chips mounted on first and second faces of a printed circuit board comprising:

liquid-cooling plates having therein passage means for flowing liquid coolant under pressure and a plurality of liquid coolant supply head means; and
a plurality fo resilient heat transfer means held by each said liquid-cooling plates and arranged in alignment with said integrated circuit chips, each of said resilient heat transfer means having a liquid coolant receiving chamber closed at one end thereof by a heat transfer plate in compressive contact with one of said integrated circuit chips on said first and second faces of said printed circuit board wherein equal but opposite pressure is applied to said first and second faces of said printed circuit board by said resilient heat transfer means held by each said liquid cooling plates, and at another end of said liquid coolant receiving chamber fluidly communicating with one of said liquid coolant supply head means, said liquid coolant supply head means being fluidly and serially intercommunicated with one another by means of said passage means, wherein each of said liquid coolant supply head means comprises a liquid coolant chamber formed in each said liquid-cooling plate and having a liquid inlet and a liquid outlet, and a nozzle means connected to said liquid inlet of said liquid coolant chambser and directed toward each said heat transfer plate for impinging said liquid coolant against each said heat transfer plate.

2. A liquid-cooling module, according to claim 1, wherein each of said resilient heat transfer means comprises a hollow resilient member having one end connected to said liquid-cooling plate at a position around one of said liquid coolant supply heads and the other end attached to said heat transfer plate.

3. A liquid-cooling module, according to claim 2, wherein said hollow resilient member is comprised of bellows.

4. A liquid-cooling module, according to claim 2, wherein said hollow resilient member is comprised of a diaphragm member.

5. A liquid-cooling module for cooling integrated circuit chips mounted on first and second faces of a printed circuit board comprising:

liquid-cooling plates having therein passage means for flowing liquid coolant under pressure and a plurality of liquid coolant supply head means; and a plurality of resilient heat transfer means held by each said liquid-cooling plates and arranged in alignment with said integrated circuit chips, each of said resilient heat transfer means having a liquid coolant receiving chamber closed at one end thereof by a heat transfer plate by a means for holding said heat transfer plate in compressive contact with one of said integrated circuit chips on said first and second faces of said printed circuit board, said plurality of resilient heat transfer means applying opposite but equal pressure to each face of said printed circuit board, and at another end of said liquid coolant receiving chamber fluidly communicating with one of said liquid coolant supply head means, said liquid coolant supply head means being fluidly and serially intercommunicated with one another by means of said passage means, wherein each of said liquid coolant supply head means comprises a cylindrical liquid coolant chamber formed in said liquid cooling plate and having a liquid inlet for introducing said liquid coolant into said cylindrical liquid coolant chamber as a spiral flow of said liquid coolant and a liquid outlet for discharging said liquid coolant from said cylindrical liquid coolant chamber.

6. A liquid-cooling module, according to claim 5, wherein said liquid outlet of each of said liquid coolant supply heads is fluidly connected to said liquid inlet of adjacent downstream one of said liquid coolant, supply heads by means of said passage means.

7. A printed circuit board assembly comprising:

a printed circuit board having first and second faces having mounted thereon a plurality of electronic circuit components, each of said electronic circuit components comprising a semiconductor chip having a top face thereof to which a heat dissipation plate, having a surface area larger than that of said top face of said semiconductor chip, is attached;

a pair of first and second liquid-cooling modules arranged on said first and second faces of said printed circuit board, said first and second liquid-cooling modules removing heat generated by said plurality of electronic circuit components mounted on said first and second faces of said printed circuit board, each of said first and second liquid-cooling modules comprising a cooling plate having therein passage means for flowing a liquid coolant under pressure, said first and second liquid-cooling modules further comprising a plurality of resilient heat transfer means intervened between said cooling plate and said printed circuit board, said plurality of resilient heat transfer means being in substantial alignment with said plurality of electronic circuit components, said cooling plate of each of said first and second liquid cooling modules comprising a plurality of liquid coolant supply head means arranged in alignment with said plurality of resilient heat transfer means of each of said first and second liquid-cooling modules, for supplying a flow of said liquid coolant under pressure from said passage means to said plurality of resilient heat transfer means, each of said resilient heat transfer means having, at one end thereof, a heat transfer plate cooled by said liquid coolant fed from said cooling plate, said plurality of resilient heat transfer means being kept in a compressed state so that a resilient force generated in said plurality of resilient transfer means and a pressure, exhibited by the liquid coolant under pressure, place said plurality of resilient heat transfer means in compressive contact with said plurality of electronic circuit components, said plurality of resilient heat transfer means applying opposite but equal pressure on said first and second faces of said printed circuit board for eliminating mechanical stress; and a heat transfer sheet intervened between said heat transfer plate of said plurality of resilient heat transfer means and said heat dissipation plate of said semiconductor chip, said heat transfer sheet being compliant to compression acting thereon.

8. A printed circuit board assembly comprising:

a printed circuit board having first and second faces having mounted thereon a plurality of electronic circuit components, each of said electronic circuit components comprising a semiconductor chip having a top face thereof to which a heat dissipation plate, having a surface area larger than that of said top face of said semiconductor chip, is attached; and a pair of first and second liquid-cooling modules arranged on said first and second faces of said printed circuit board, said first and second liquid-cooling modules removing heat generated by said plurality of electronic circuit components mounted on said first and second faces of said printed circuit board, each of said first and second liquid-cooling modules comprising a cooling plate having therein passage means for flowing a liquid coolant under pressure, said first and second liquid-cooling modules further comprising a plurality of resilient heat transfer means intervened between said cooling plate and said printed circuit board, said plurality of resilient heat transfer means being in substantial alignment with said plurality of electronic circuit components, said cooling plate of each of said first and second liquid cooling modules comprising a plurality of liquid coolant supply heat means arranged in alignment with said plurality of resilient heat transfer means of each of said first and second liquid-cooling modules, for supplying a flow of said liquid coolant under pressure from said passage means to said plurality of resilient heat transfer means, each of said resilient heat transfer means having, at one end thereof, a heat transfer plate cooled by said liquid coolant fed from said cooling plate, said plurality of resilient heat transfer means being kept in a compressed state so that a resilient force generated in said plurality of resilient transfer means and a pressure, exhibited by the liquid coolant undesr pressure, place said plurality of resilient heat transfer means is compressive contact with said plurality of electronic circuit components, said plurality of resilient heat transfer means applying opposite but equal pressure on said first and second faces of said printed circuit board to eliminate mechanical stress on said plurality of electronic circuit components.

9. A printed circuit board assembly comprising:

a printed circuit board having first and second faces having mounted thereon a plurality of electronic circuit components; and a pair of first and second liquid-cooling modules arranged on said first and second faces of said printed circuit board, said first and second liquid-cooling modules removing heat generated by said plurality of electronic circuit components mounted on said first and second faces of said printed circuit board, each of said first and second liquid-cooling modules comprising a cooling plate having therein passage means for flowing a liquid coolant under pressure, said first and second liquid-cooling modules further comprising a plurality of resilient heat transfer means intervened between said cooling plate and said printed circuit board, said plurality of resilient heat transfer means being in substantial alignment with said plurality of electronic circuit components, said cooling plate of each of said first and second liquid cooling modules comprising a plurality of liquid coolant supply head means arranged in alignment with said plurality of resilient heat transfer means of each of said first and second liquid-cooling modules, for supplying a flow of said liquid coolant under pressure from said passage means to said plurality of resilient heat transfer means, each of said resilient heat transfer means having, at one end thereof, a heat transfer plate cooled by said liquid coolant fed from said cooling plate, said plurality of resilient heat transfer means being kept in a compressed state so that a resilient force generated in said plurality of resilient transfer means and a pressure, exhibited by the liquid coolant under pressure, place said plurality of resilient heat transfer means in compressive contact with said plurality of electronic circuit components, said plurality of resilient heat transfer means applying opposite but equal pressure on said firs and second faces of said printed circuit board to eliminate mechanical stress.

10. A printed circuit board assembly according to claim 9, wherein said electronic circuit component on said first and second faces of said printed board comprises a semiconductor chip having a to face thereof to which a heat dissipation plate having a surface area larger than that of said top face of said semiconductor chip is attached, and including means holding said heat dissipation plate compressed with said heat transfer plate.

11. A printed circuit board assembly according to claim 10, further comprising a heat transfer sheet intervened between said heat transfer plate of said resilient heat transfer means and said heat dissipation plate of said semiconductor chip, said heat transfer sheet being compliant to compression acting thereon.

12. A printed circuit board assembly according to claim 11, wherein said heat transfer and dissipation plates are made of metal and wherein said intervened heat transfer sheet is made of electrically insulating material.

13. A printed circuit board assembly according to claim 9, wherein each of said plurality of electronic circuit components comprises a bare chip having a top face.

14. A printed circuit board assembly according to claim 13, further comprising a heat transfer sheet intervened between said top face of said bare chip and said heat transfer plate of said resilient heat transfer means, said heat transfer sheet compliant to compression acting thereon.

15. A printed circuit board assembly according to claim 14, wherein said bare chip is mounted on respective said first and second faces of said printed circuit board, wherein said heat transfer plate of said resilient heat transfer means is made of metal, and wherein said intervened heat transfer sheet is made of electrically insulating material.

16. A printed circuit board assembly according to claim 9, wherein said resilient heat transfer means comprises a resilient hollow member having two spaced open ends defining therebetween a hollow chamber for receiving therein said flow of said liquid coolant under pressure, one of said two spaced open ends connected to said cooling plate around said liquid coolant supply head means and the other of said two spaced open ends closed by said heat transfer plate.

17. A printed circuit board assembly according to claim 9, wherein each of said liquid coolant supply head means of said each cooling plate comprises a coolant chamber fluidly connected to said each resilient heat transfer means and closed by said heat transfer plate of said each resilient heat transfer means, said coolant chamber being provided with a liquid coolant inlet means for introducing therein said liquid coolant under pressure and a liquid coolant outlet means for discharging therefrom said liquid coolant under pressure.

18. A printed circuit board assembly according to claim 17, wherein said liquid coolant inlet means of said plurality of liquid coolant supply head means comprises a liquid coolant inlet nozzle, for supplying said liquid coolant toward said heat transfer plates of said resilient heat transfer means, said liquid coolant inlet nozzle tightly fitted in bores foremed in each said cooling plate of said first and second liquid-cooling modules.

19. A printed circuit board assembly according to claim 18, wherein said bores formed in each said cooling plate of said first and second liquid-cooling modules are all inclined with respect to a vertical line to said heat transfer plate of said resilient heat transfer means and arranged in parallel with one another.

20. A printed circuit board assembly according to claim 17, wherein each of said coolant chambers or each cooling plate of said first and second liquid-cooling modules is a cylindrical chamber having a central axis thereof vertical to said heat transfer plate of said resilient heat transfer means and wherein said liquid coolant inlet means of said cylindrical liquid coolant chamber is disposed in a plane separate from a plane containing therein said central axis so that said liquid coolant inlet means may introduce said liquid coolant under pressure into said cylindrical liquid coolant chamber as a spiral flow of said liquid coolant.

21. A printed circuit board assembly according to claim 17, wherein said coolant chambers of said liquid coolant supply head means are arranged in alignment with one another along a straight line parallel with one of said first and second faces of said printed circuit board so as to form a set of coolant chambers fluidly intercommunicating with one another in series through liquid communication of said liquid coolant outlet means and said liquid coolant inlet means of adjacent coolant chambers via said passage means of said cooling plate.

22. A printed circuit board assembly according to claim 21, wherein a plurality of sets of said liquid coolant chambers are arranged in parallel with one another in each said cooling plates of said first and second liquid-cooling modules.

23. A printed circuit board assembly according to claim 22, wherein said plurality of sets of coolant chambers are connected to one another by means of additional passage means so that an equal amount of said liquid coolant under pressure flows through said pluraltiy of sets of coolant chambers.

24. A printed circuit board assembly according to claims 9, wherein respective said sets of coolant chambers of each said cooling plate of each of said first and second liquid-cooling modules are connected to a common liquid inlet passage via respective first branch passages having different radii of curvature and to a common liquid outlet passage via respective second branch passages having different radii of curvature, said common liquid inlet passage being fluidly connected to a liquid coolant supply source and said common liquid outlet passage being fluidly connected to a heat exchange means, and wherein said radii of curvature of at least one of said first and second branch passages are fixed so that an equal amount of said liquid coolant under pressure flows through said sets of liquid coolant chambers respectively.

* * * * *